United States Patent [19]

Kishi et al.

[11] Patent Number: 4,684,435
[45] Date of Patent: Aug. 4, 1987

[54] METHOD OF MANUFACTURING THIN FILM TRANSISTOR

[75] Inventors: Kohhei Kishi; Mitsuhiro Koden, both of Nara; Fumiaki Funada, Yamatokoriyama, all of Japan

[73] Assignee: Sharp Kabushiki Kaisha, Osaka, Japan

[21] Appl. No.: 829,001

[22] Filed: Feb. 13, 1986

[30] Foreign Application Priority Data

Feb. 13, 1985 [JP] Japan ................................. 60-27393
Feb. 13, 1985 [JP] Japan ................................. 60-27394

[51] Int. Cl.$^4$ ........................ H01L 21/306; C23F 1/02
[52] U.S. Cl. ......................... 156/632; 148/DIG. 100; 156/650; 156/652; 156/655; 156/661.1; 437/245
[58] Field of Search ............... 156/632, 650, 655, 652, 156/648, 649, 661.1, 659.1, 630; 29/591, 569 L; 148/DIG. 100

[56] References Cited

U.S. PATENT DOCUMENTS

| | | | |
|---|---|---|---|
| 3,904,461 | 9/1975 | Estep | 156/650 |
| 4,358,748 | 11/1982 | Gruner | 156/650 X |
| 4,404,731 | 9/1983 | Poleshuk | 29/591 X |
| 4,428,796 | 1/1984 | Milgram | 156/652 X |
| 4,502,917 | 3/1985 | Chamberlin | 156/652 X |
| 4,624,737 | 11/1986 | Shimbo | 156/652 X |

FOREIGN PATENT DOCUMENTS

| | | | |
|---|---|---|---|
| 60-182134 | 9/1985 | Japan | 148/DIG. 100 |
| 60-186022 | 9/1985 | Japan | 148/DIG. 100 |

*Primary Examiner*—Kenneth M. Schor
*Attorney, Agent, or Firm*—Birch, Stewart, Kolasch & Birch

[57] ABSTRACT

An improved process for manufacturing a thin film transistor uses two masks for etching and therefore one mask alignment. The technical effect of said process is to provide the thin film transistor with low cost and enhanced yield.

1 Claim, 28 Drawing Figures

METHOD OF MANUFACTURING THIN FILM TRANSISTOR

FIELD OF THE INVENTION

The present invention relates to a process for manufacturing a thin film transistor (hereinafter referred to as TFT) usable for an active matrix type liquid crystal display device.

BACKGROUND OF THE INVENTION

An active matrix type liquid crystal display device, placing TFT on a display cell substrate in a matrix form, is a device which makes possible mass storage display of high quality. The device has been intensively applied to televisions and the like.

A conventional process for manufacturing TFT array substrates suitable for liquid crystal televisions will be illustrated based on FIGS. 14(A) and (B). FIG. 14(A) shows a plane view of one picture element of the TFT array manufactured by a conventional process. FIG. 14(B) shows an X—X' sectional view of the picture element. A metal layer such as Al and the like is formed on a transparent insulation substrate 70 and patterned by photo-etching to form a gate electrode bar 71. A gate insulation layer 72 made from an oxide film or a nitride film and a semiconductor layer 73 made from Si, CdS and the like are successively laminated and the semiconductor layer 73 is etched. On the semiconductor 73, a transparent electrode layer is laminated and etched to form a source electrode bar 76 and a drain electrode or display electrode 77.

As described above, the conventional process requires at least two mask alignments, because it employs at least three for etching. This complicates the manufacturing process of the TFT array substrate and causes high cost and low yield.

SUMMARY OF THE INVENTION

An object of the present invention is to simplify a process for TFT array substrates by way of using two mask layers and one mask alignment to improve producibility. The present invention is to provide a process for manufacturing a thin film transistor comprising;

forming four layers by successively laminating on a insulation substrate a metal layer as a gate electrode, a first insulation layer as a gate insulation layer, a semiconductor layer and an electrode layer which makes an ohmic contact with said semiconductor layer, etching said four layers by a photoresist to form a pattern, laminating a second insulation layer with remaining said photoresist, removing the remaining photoresist to form a pattern by a lift-off process, laminating a transparent conductive layer as a source and drain electrode and a display electrode, etching said transparent conductive layer and said electrode layer.

Another object of the present invention is to provide a process for manufacturing a thin film transistor comprising;

forming four layers by successively laminating on a insulation substrate a metal layer as a gate electrode, a first insulation layer as a gate insulation layer, a semiconductor layer and an electrode layer which makes an ohmic contact with said semiconductor layer, etching said four layers by a photoresist to form a pattern, anodic-oxidazing said metal layer in its pattern edge to form a second insulation layer, laminating a transparent conductive layer as a source and drain electrode and a display electrode, etching said transparent conductive layer and said electrode layer.

DETAILED DESCRIPTION OF THE PREFERRED EMBODIMENTS

The present invention will be illustrated by examples based on the drawings.

EXAMPLE 1

Figure 1A:
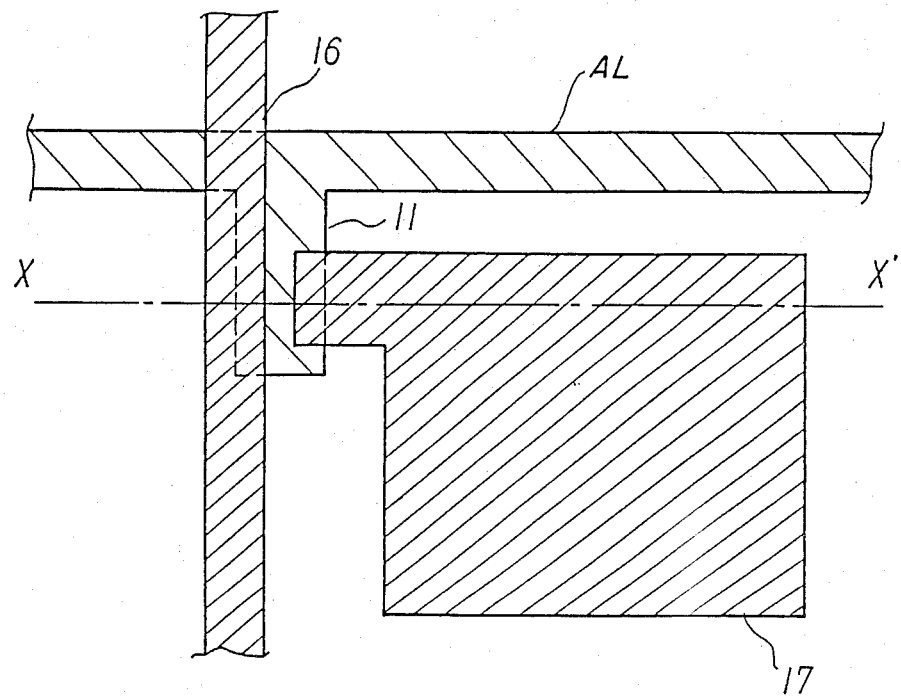
FIGS. 1(A) and (B) show a plane view and an X—X' sectional view of the first embodiment of the TFT of the present invention.
Figure 1B:
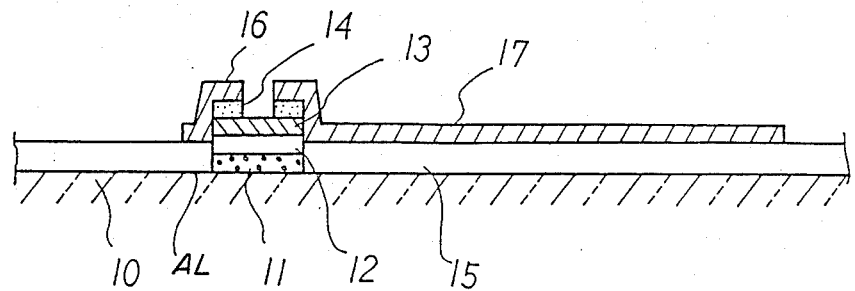

FIGS. 1(A) and (B) show a plane view and an X—X' sectional view of one picture element of the TFT array substrate produced by the process of the present invention. Two masks are employed in this embodiment, one is for patterning a gate electrode bar 11, a gate insulation layer 12, a semiconductor layer 13 and an electrode layer 14 which forms an ohmic contact with a semiconductor layer 13. The other is for patterning a source electrode bar 16, a drain electrode or display electrode 17 and the electrode layer 14. The manufacturing process and the concrete construction are explained by FIGS. 2 to 7.

Figure 2A:
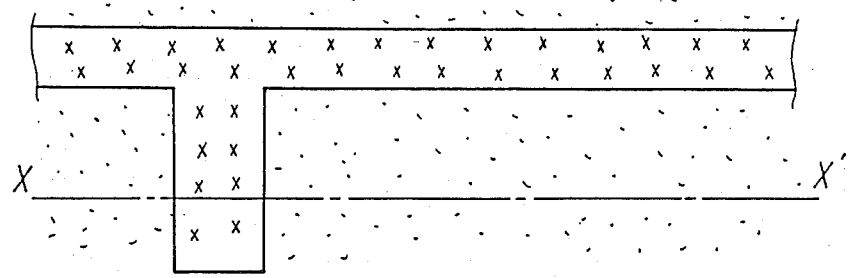
FIGS. 2(A) and (B) to FIGS. 7(A) and (B) show plane views and X—X' sectional views, explaining the first embodiment of the process for manufacturing the TFT of the present invention.
Figure 2B:
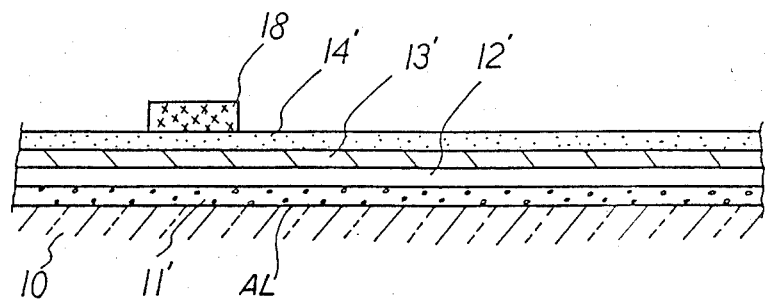

Step I (see FIGS. 2(A) and (B))

An Al layer 11', which will make the gate electrode bar 11, is deposited on a glass substrate 10 in a thickness of 2,000A by a sputtering. The gate insulation layer 12' of $Si_3N_4$, the semiconductor layer 13' of amorphous hydrogenated silicon (a—Si:H) and the electrode layer 14' of phosphorus-doped a—Si:H (n+a—Si:H) which forms an ohmic contact with a—Si:H 13' are successively laminated on the Al layer 11' by way of a plasma CVD. The thickness of the layers are respectively 2,000A, 2,000A and 1,000A. After forming four layers, a photoresist 18 is coated and exposed by using the first mask to develope.

Figure 3A:
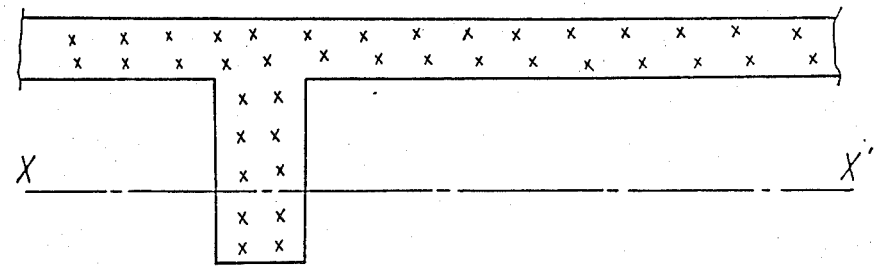
Figure 3B:
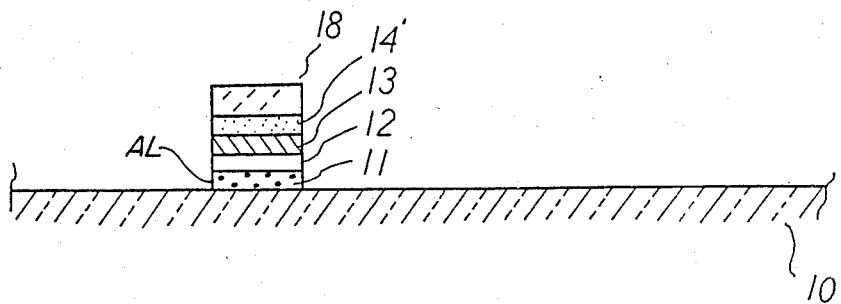

Step II (see FIGS. 3(A) and (B))

The four layers manufactured by the step I are etched to form a pattern. The etchant of the n+a—Si:H 14' and the a—Si:H 13' is a mixture solution of HF and $HNO_3$ and the etchant of $Si_3N_4$ is a 5% HF solution. The etchant of the Al layer 11' is an aqueous H₃PO₄ solution. The etching can be conducted by immersing the substrate in the etchants and etching with the same pattern.

Figure 4A:
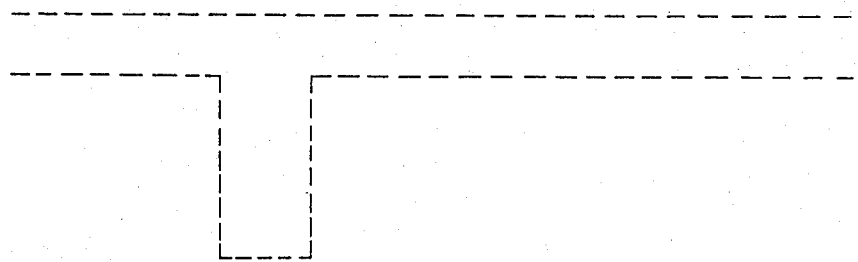

Step III (see FIGS. 4(A) and (B))

In this step, the second insulation layer 15 of $Si_3N_4$ is laminated over the remaining photoresist 18 and covers the gate electrode bar 11 with the insulation layer. The purpose of this step is to prevent an electrical contact of the gate electrode bar 11 with the source electrode bar 16 and the drain electrode or display electrode 17. The second insulation layer 15 can be formed by laminating the $Si_3N_4$ layer in a thickness of 5,000A at 100° C. by a plasma CVD, whereby the covering is completed.

Figure 5A:
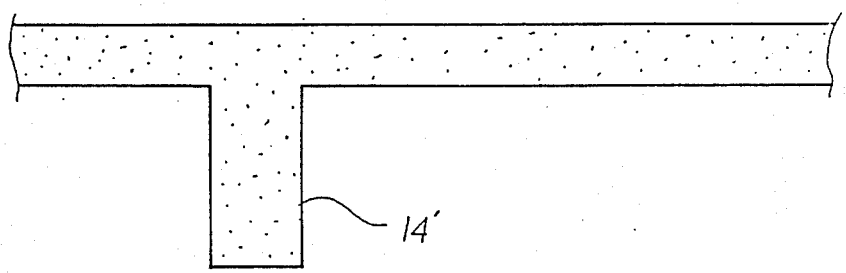
Figure 5B:
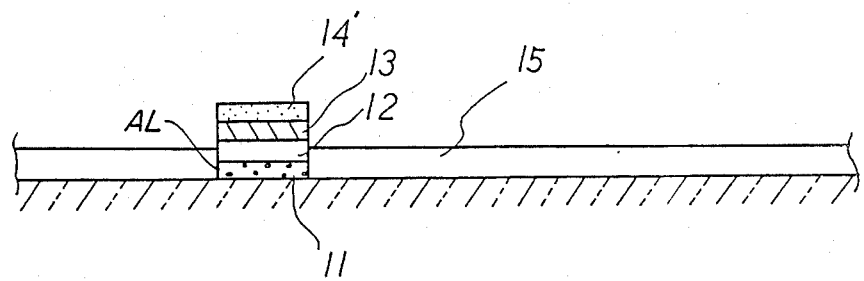

Step IV (see FIG. 5 (A) and (B))

In this step, the $Si_3N_4$ insulation layer 15 on the photoresist 18 is immersed in a resist remover to remove it together with the photoresist 18, that is, it is patterned by a so-called lift-off process. By removing the photoresist, the n+a—Si:H 14' surface appears.

Figure 6A:
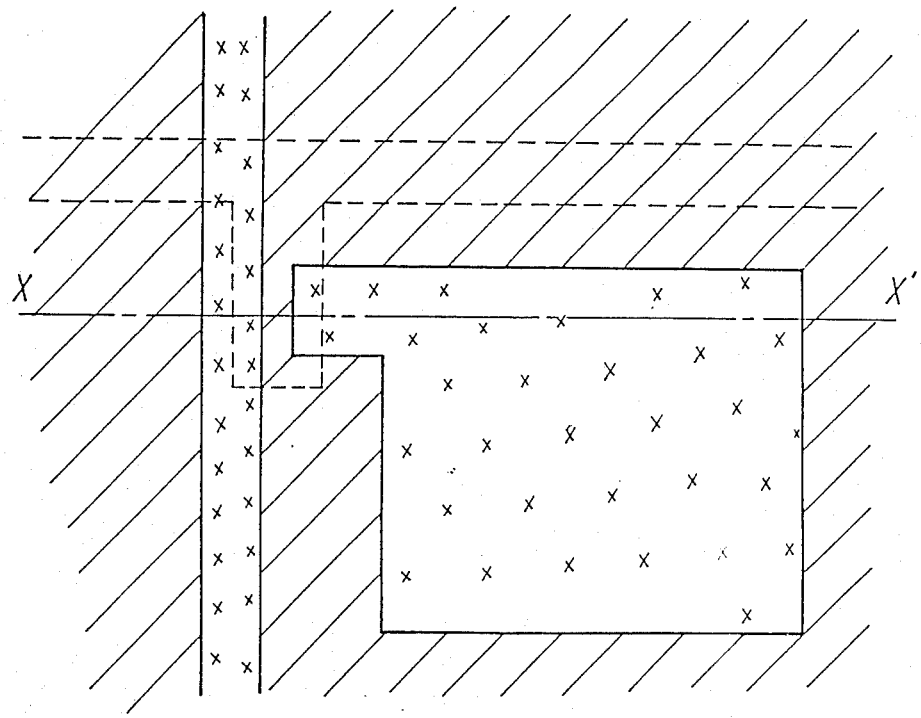
Figure 6B:
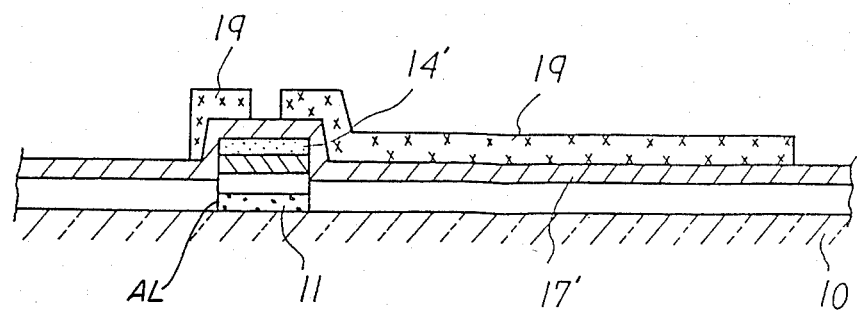

Step V (see FIG. 6 (A) and (B))

In this step, the transparent conductive layer 17' is laminated on all surfaces, containing the n³⁰a—Si:H 14' in a thickness of 3,000A by a vacuum evaporation for making the source electrode bar 16 and the drain electrode or display electrode 17. After laminating it, a photoresist 19 is coated on it and exposed by using the second mask to develop to a desirable shape. The mask alignment is conducted only once in this step, which makes the process simple and leads low cost products.

Figure 7A:
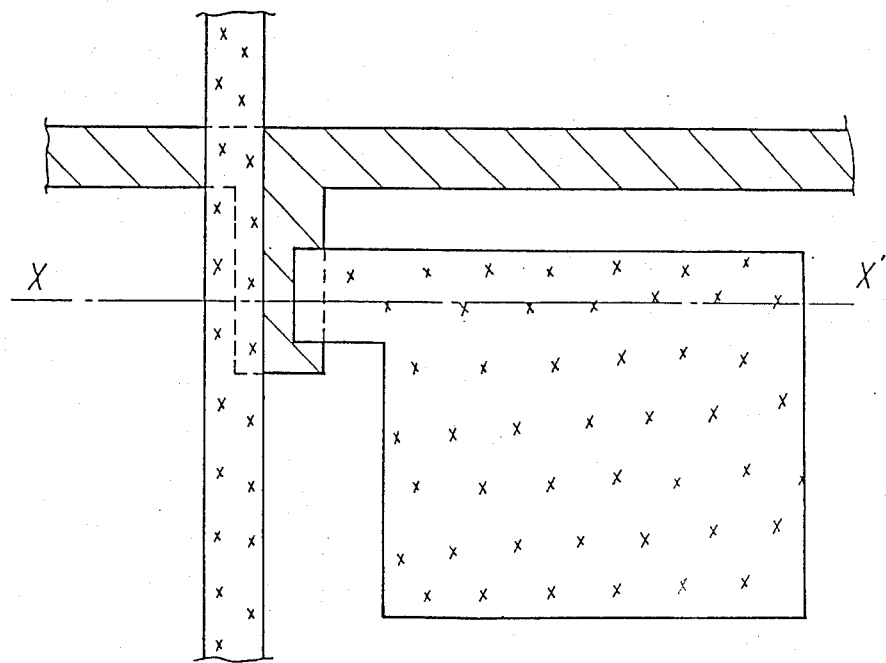
Figure 7B:
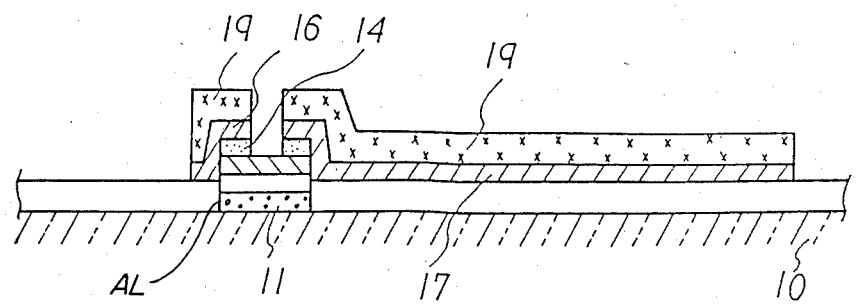

Step VI (see FIG. 7 (A) and (B))

In this step, the transparent conductive layer 17' is etched with the photoresist 19 to make a pattern of the source electrode bar 16 and the drain electrode or display electrode 17, followed by etching the n+a—Si:H 14' which forms an ohmic contact. The etchant of the transparent conductive 17' is a HCl solution and the etchant of the n+a—Si:H 14' is a mixture solution of HF and HNO₃. Etching of the transparent conductive layer 17' is conducted by immersing the laminated substrate in the etchants to form the source electrode bar 16 and the drain electrode or display electrode 17. Further, the n+a—Si:H layer 14' is etched to the electrode 14 which forms an ohmic contact of the a—Si:H semiconductor layer 13 with the source electrode bar 16 and the drain electrode 17.

Step VII

The photoresist 19 is removed to form a TFT as shown in FIG. 7 (A) and (B).

The resultant TFTs are placed in a matrix form on the substrate and the gate electrode bar 11 and the source electrode bar 16 are extended in a matrix direction to contact with the other TFTs, which constitutes TFT array substrate. If the TFT array substrate is used as a cell substrate of a liquid crystal display device, mass storage display information can appear in its display as a clear picture.

According to the present invention, TFTs are produced by using two masks and therefore mask alignment, which is a most complicated treatment, can be done only once. This makes low cost and causes high yield.

EXAMPLE 2

Figure 8A:
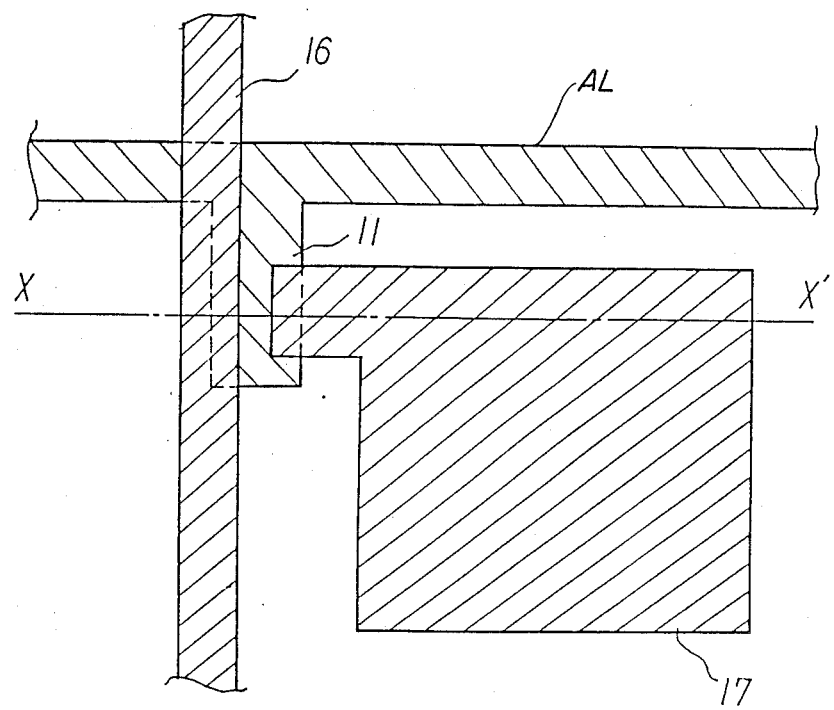
FIGS. 8(A) and (B) show a plane view and an X—X' sectional view of the second embodiment of the TFT of the present invention.
Figure 8B:
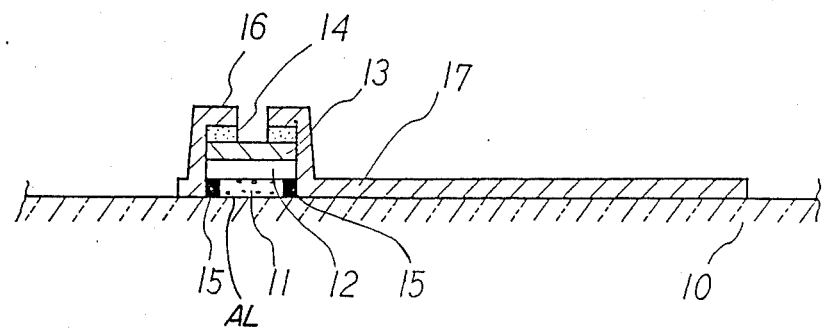

FIG. 8 (A) and (B) show a plane view and an X—X' sectional view of one picture element of the TFT array substrate produced by the process of the present invention. Two masks are employed in this embodiment, one is for patterning a gate electrode bar 11, a gate insulation layer 12, a semiconductor layer 13 and an electrode layer 14 which forms an ohmic contact with a semiconductor layer 13. The other is for patterning a source electrode bar 16, a drain electrode or display electrode 17 and the electrode layer 14. The manufacturing process and the concrete construction are explained by FIGS. 9 to 13.

Figure 9A:
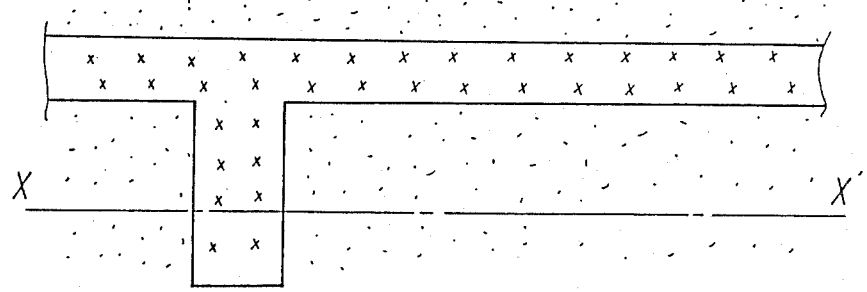
FIGS. 9(A) and (B) to FIGS. 13(A) and (B) show plane views and X—X' sectional views, explaining the second embodiment of the process for manufacturing the TFT of the present invention.
Figure 9B:
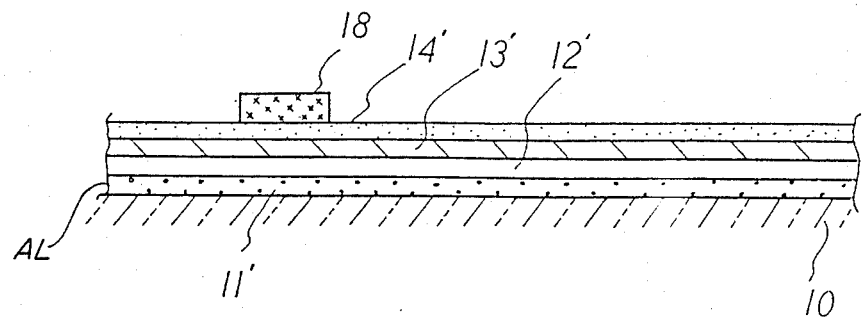

Step I (see FIG. 9 (A) and (B))

An Al layer 11' which will make the gate electrode bar 11, is deposited on a glass substrate 10 in a thickness of 2,000A by a sputtering. The gate insulation layer 12' of $Si_3N_4$, the semiconductor layer 13' of amorphous hydrogenated silicon (a—Si:H) and the electrode layer 14' of phosphorusdoped a—Si:H (n+a—Si:H) which forms an ohmic contact with a—Si:H 13', are successively laminated on the Al layer 11' by way of a plasma CVD. The thickness of the layers are respectively 2,000A, 2,000A and 1,000A. After forming four layers, a photoresist 18 is coated and exposed by using the first mask for developing.

Figure 10A:
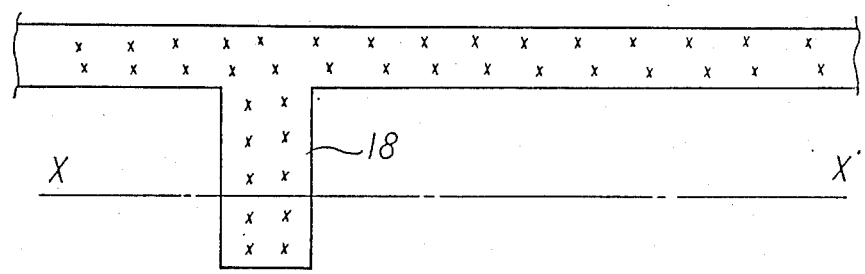
Figure 10B:
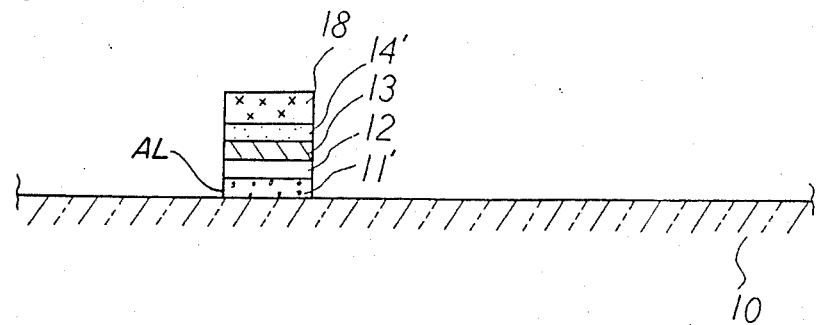
Figure 11A:
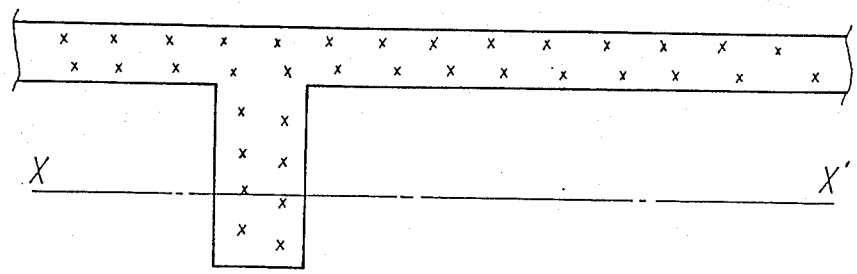
Figure 11B:
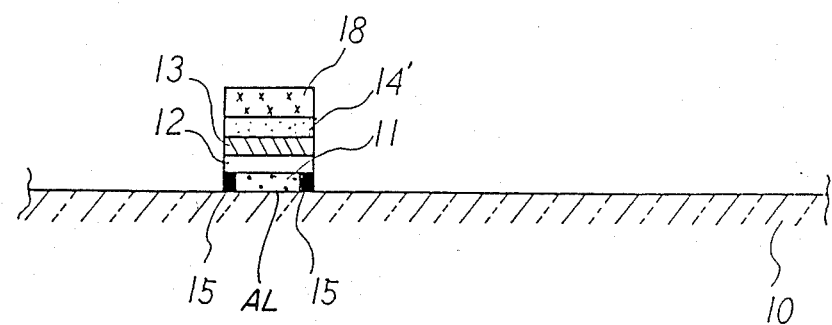

Step II (see FIG. 10 (A) and (B))

The four layers manufactured by the above step I are etched to form a pattern. The etchant of the n+a—Si:H 14' and the a—Si:H 13' is a mixture solution of HF and HNO₃ and the etchant of $Si_3N_4$ is a 5% HF solution. The etchant of the Al layer 11' is an aqueous H₃PO₄ solution. The etching can be conducted by immersing the substrate in the etchants and etching with the same pattern.

Figure 4B:
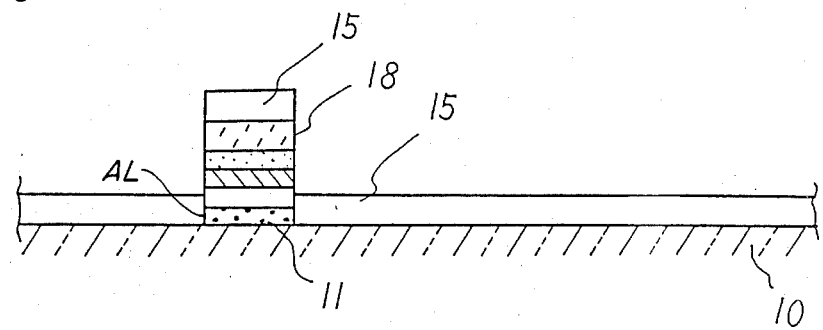

Step III (see FIG. 4 (A) and (B)

In this step, the Al layer 11' which will give the gate electrode bar 11 is anodic-oxidized in the pattern edge portion. The purpose of this step is to prevent an electrical contact of the gate electrode bar 11 with the source electrode bar 16 and the drain electrode or display electrode 17. The anodic oxidation of the pattern edge portion is conducted by treating it in an ammonium borate solution at 40 volts to form $Al_2O_3$ 15 in the pattern edge portion of the gate electrode bar 11.

In the above process, the gate electrode 11 employs Al and forms $Al_2O_3$ in the pattern edge, but the gate electrode bar 11 can employ so-called bulb metals such as Ta, Nb, Hf and the like, which forms insulation layer by anodic-oxidation. Among the metals mentioned above, in case of Ta, it is necessary that a $Ta_2O_5$ layer be formed before Ta layer is laminated in order to avoid damage of the glass substrate during etching.

Figure 12:
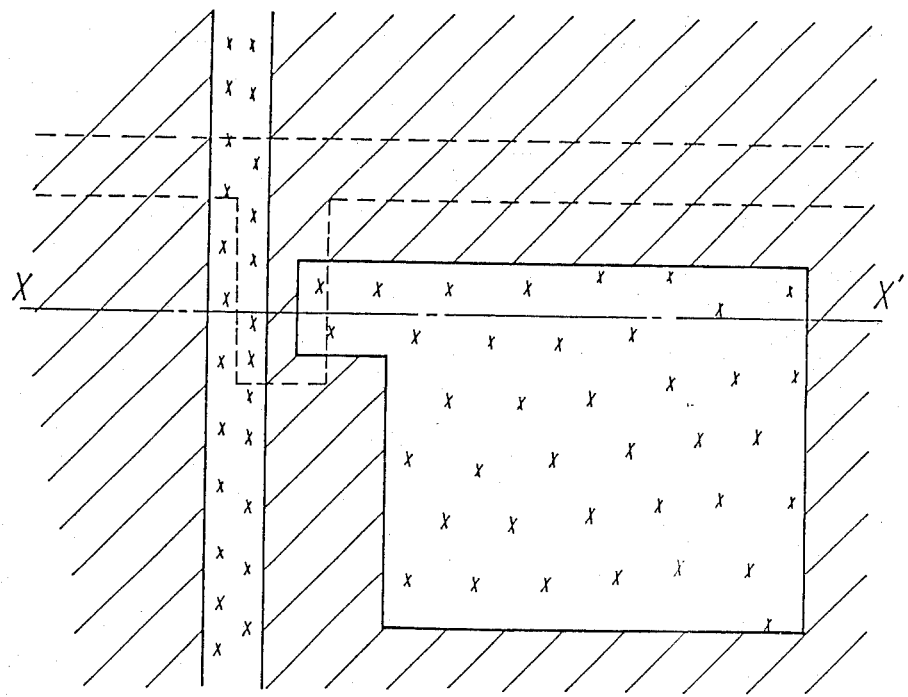
Figure 12:
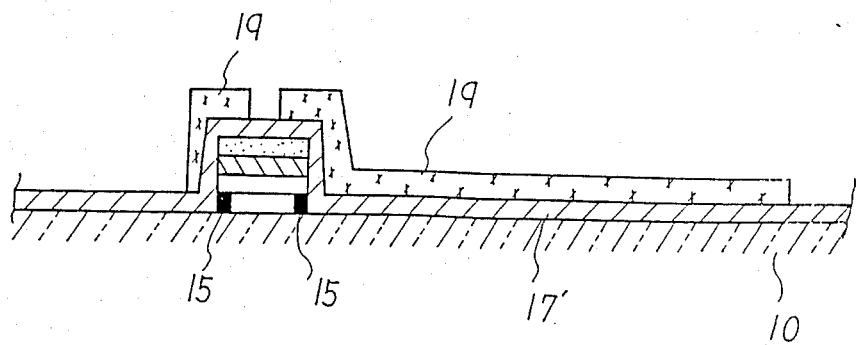

Step IV (see FIG. 12 (A) and (B))

In this step, the transparent conductive layer 17' is laminated on all surfaces, containing the n+a—Si:H 14' in a thickness of 3,000A by a vacuum evaporation for giving form to the source electrode bar 16 and the drain electrode or display electrode 17. After laminating it, a photoresist 19 is coated on it and exposed by using the second mask to develop to a desirable shape. The mask alignment is conducted only once, in this step, which makes the process simple and leads to low cost products.

Figure 13A:
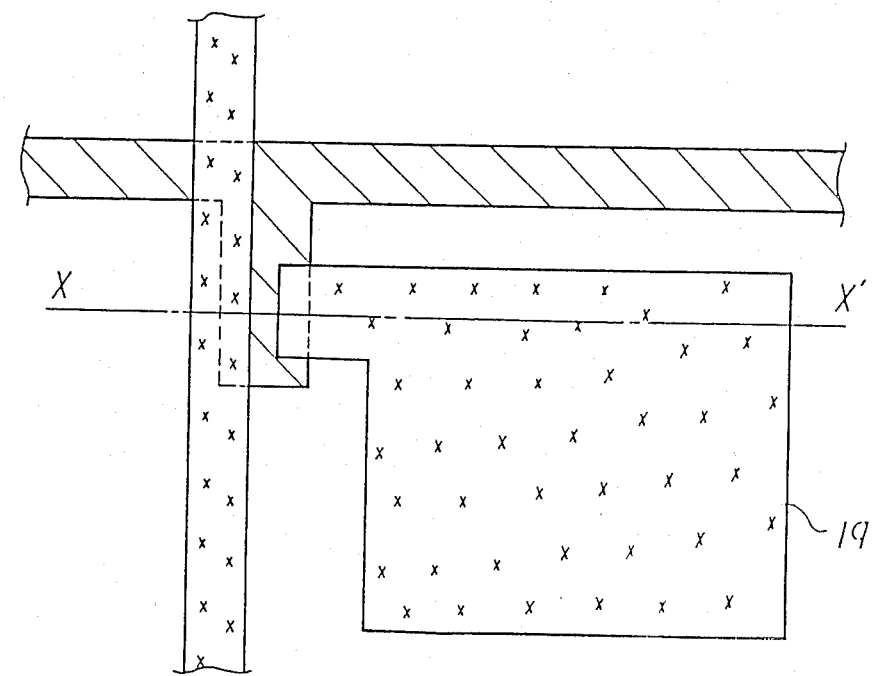
Figure 13B:
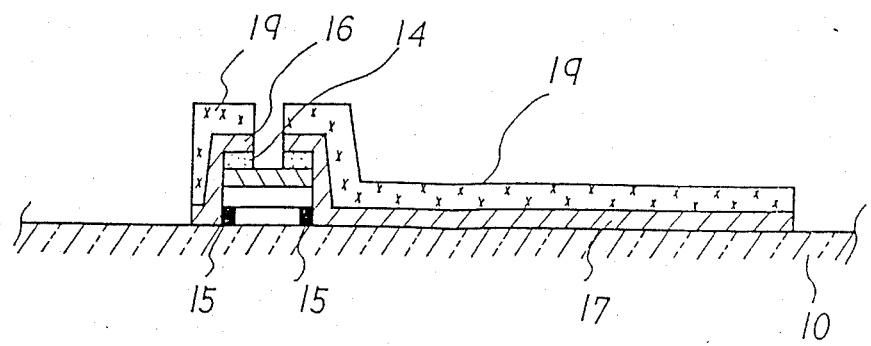
Figure 14A:
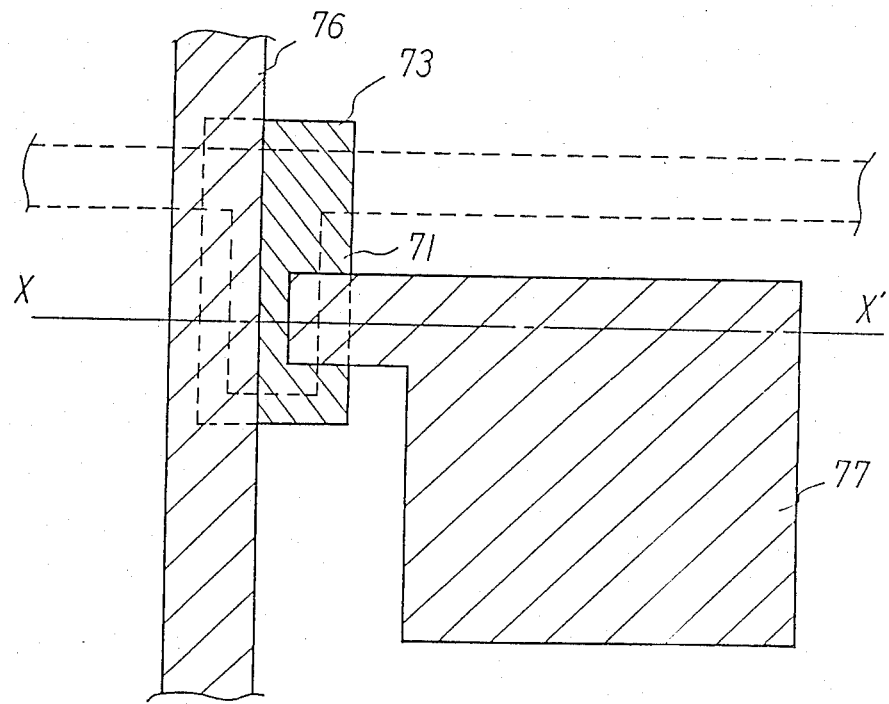
FIGS. 14(A) and (B) show a plane view and an X—X' sectional view of a conventional TFT array substrate.
Figure 14B:
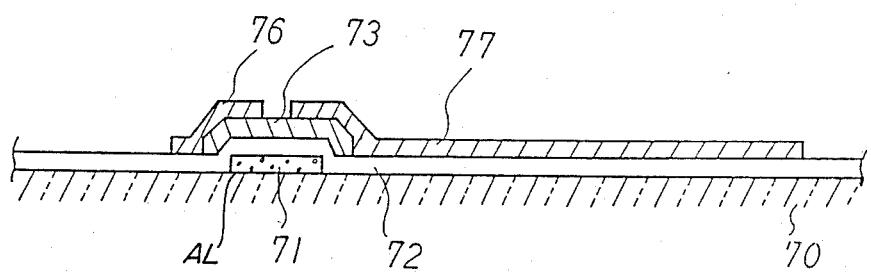

Step V (see FIG. 13 (A) and (B))

In this step, the transparent conductive layer 17' is etched with the photoresist 19 to make a pattern of the source electrode bar 16 and the drain electrode or display electrode 17, followed by etching the n+a—Si:H 14' which form an ohmic contact. The etchant of the transparent conductive layer 17' is a HCl solution and the etchant of the n+a—Si:H 14' is a mixture solution of HF and $HNO_3$. Etching of the transparent conductive layer 17' is conducted by immersing the laminated substrate in the etchants to give the source electrode bar 16 and the drain electrode or display electrode 17. Further, the n+a—Si:H layer 14' is etched to the electrode 14 which forms an ohmic contact of the a—Si:H semiconductor layer 13 with the source electrode bar 16 and the drain electrode 17.

Step VI

The photoresist 19 is removed to form a TFT as shown in FIG. 8 (A) and (B).

The resultant TFTs are placed in a matrix form on the substrate and the gate electrode bar 11 and the source electrode bar 16 are extended in a matrix direction to contact with the other TFTs, which constitutes TFT array substrate. If the TFT array substrate is used as a cell substrate of a liquid crystal display device, mass storage display information can appear in its display as a clear picture.

According to the present invention, TFTs are produced by using two masks and therefore mask alignment, which is a most complicated treatment, can be done only once. This makes for low cost and causes high yield.

What is claimed is:

1. A process for manufacturing a thin film transistor comprising:

forming four layers by successively laminating on an insulation substrate a metal layer as a gate electrode, a first insulation layer as a gate insulation layer, a semiconductor layer and an electrode layer which makes an ohmic contact with said semiconductor layer, etching said four layers by coating on a photoresist and developing it to form a pattern then applying etchant to etch said four layers in said pattern, laminating on a second insulation layer without removing the photoresist which remains after the etching step, removing the remaining photoresist by a lift-off process, laminating on a transparent conductive layer as a source electrode and a drain electrode or display electrode, etching said transparent conductive layer and said electrode layer which makes an ohmic contact with said semiconductor layer to separate them into layer portions and to thereby provide said transparent conductive layer as said source electrode and said drain or display electrode.

* * * * *